United States Patent
Park

(10) Patent No.: US 6,987,356 B2
(45) Date of Patent: *Jan. 17, 2006

(54) ACTIVE-MATRIX ORGANIC ELECTROLUMINESCENT DISPLAY

(76) Inventor: Byoung-Choo Park, 101-602, Daejin-1cha Apt., Jukjeon-ri, Suji-eup, Yongin-city, 449-752 Kyonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 10/936,146

(22) Filed: Sep. 8, 2004

(65) Prior Publication Data

US 2005/0024305 A1   Feb. 3, 2005

Related U.S. Application Data

(63) Continuation of application No. PCT/KR03/00432, filed on Mar. 6, 2003.

(51) Int. Cl.
H05B 33/26 (2006.01)
H05B 33/06 (2006.01)
(52) U.S. Cl. .................. 313/506; 313/500; 313/505
(58) Field of Classification Search ........ 313/504–506, 313/499, 500; 428/690, 917; 315/169.3
See application file for complete search history.

(56) References Cited

U.S. PATENT DOCUMENTS

| | | | | |
|---|---|---|---|---|
| 6,084,579 A | * | 7/2000 | Hirano | 345/205 |
| 6,140,766 A | | 10/2000 | Okada et al. | |
| 6,462,469 B1 | * | 10/2002 | Young | 313/504 |
| 2001/0050373 A1 | * | 12/2001 | Yamazaki et al. | 257/103 |
| 2004/0108807 A1 | * | 6/2004 | Park | 313/504 |

FOREIGN PATENT DOCUMENTS

| | | |
|---|---|---|
| JP | 10-092583 | 4/1998 |
| JP | 10-125471 | 5/1998 |

* cited by examiner

Primary Examiner—Karabi Guharay
Assistant Examiner—German Colón
(74) Attorney, Agent, or Firm—St. Onge Steward Johnston & Reens LLC

(57) ABSTRACT

An active matrix type organic electro-luminescent display (OELD) with high brightness, low power consumption and high reliability is provided. A triode organic electro-luminescent device that has higher brightness under lower operating voltage, comparing to the conventional organic light-emitting diode having two terminals, is electrically connected to a pixel portion of the OELD. Accordingly, when the spirit of the present invention is applied to a display having an organic luminescent device, it is possible to make electrical appliances having low power consumption and high brightness.

15 Claims, 11 Drawing Sheets

EMISSION

EMISSION

EMISSION

ACTIVE-MATRIX ORGANIC ELECTROLUMINESCENT DISPLAY

This application is a continuation of pending International Patent Application No. PCT/KR2003/000432 filed Mar. 6, 2003, which designates the United States and claims priority of pending Korean Patent Application No. 2002-12615, filed Mar. 8, 2002.

FIELD OF THE INVENTION

The present invention relates to an active matrix type organic electro-luminescent display (OELD), and more particularly to, an active matrix type OELD having high brightness of luminance under low driving voltage.

BACKGROUND OF THE INVENTION

Recently, a two-terminal organic luminescent device has been developed as a self-emission device, and thus an OELD panel or an OELD device employing the two-terminal organic luminescent device has been actively studied.

The two-terminal organic luminescent device is typically referred to as an organic light emitting diode (OLED). The OLED has a pair of electrodes, that is a cathode and an anode, and an organic light-emitting layer interposed between the cathode and the anode. The representative OLED has a structure of anode/hole transporting layer/organic light-emitting layer/electron transporting layer/cathode, which was suggested by Tang et al. The OLED with such a multi-layered structure has high luminescent efficiency and thus has been adopted in almost all kinds of current OELDs under the development. Further, a hole injecting layer may be formed between the anode and the hole transporting layer or an electron injecting layer may be formed between the electron transporting layer and the cathode.

When a voltage is applied to the OELD, the electrons from the cathode and the holes from the anode are injected into the organic light-emitting layer, and thereafter the recombination of the injected holes and electrons at the organic light-emitting layer excites the emitting centers, thereby emitting electro-luminescent (EL) lights. In the present specification, all layers interposed between the cathode and the anode are referred to as an "EL layer". Therefore, the EL layer can include the above-mentioned hole injecting layer, hole transporting layer, light-emitting layer, electron transporting layer and electron injecting layer. A single organic layer can also be used to form the EL layer. Also, luminescence from the EL device in the present specification is referred to as a "driving of the EL device".

Driving system of the OELD includes a passive matrix type system and an active matrix type system. The passive matrix type OELD has an anode of transparent electrode formed on a transparent insulating substrate in the form of stripe patterns, an organic EL layer and a cathode of metal in the form of stripe patterns perpendicular to the anode, which are sequentially formed.

In the passive matrix type OELD, one of scanning lines of cathode (or anode) is selected and one or more data signal lines of anode (or cathode) among plurality of data signal lines that are connected to the selected scanning line are selected. Thus, luminescence is produced from the pixels connected to the selected scanning line and the selected data signal lines. Date signal (or video signal) inputted from an outside is edited by a signal driving circuit, thereby being produced as a signal line. Integrated circuit (IC) Chip for the signal line driving circuit may be mounted on a display in a manner of tape automated bonding (TAB) or may be directly bonded to a pixel substrate, thereby being assembled with the display.

The active matrix type OELD includes a driving semiconductor element and a switching semiconductor element which are prepared for each of a plurality of pixels arranged in the form of matrix type. The semiconductor elements are connected to one of the cathode and the anode of the OELD, thereby controlling current of the OELD. Unit pixel of the active matrix type OELD includes an OLED and a transistor (or transistors) having a semiconductor film formed on an insulating substrate. Here, the transistor having a semiconductor film is hereinafter referred to as "a thin film transistor (TFT)".

In detail, the active matrix type OELD has a plurality of OLEDs, a plurality of gate signal lines, a plurality of source signal lines, a plurality of power supply lines, a plurality of TFTs for driving and switching and a plurality of capacitors, which are formed on the insulating substrate. Generally, at least two TFTs including at least one switching TFT and at least one driving TFT and one capacitor are provided for each of pixels in the active matrix type OELD.

Recently considerable progress has been made in manufacturing the TFT on the substrate. In particular, a TFT made of poly silicon has a higher mobility than that of a conventional TFT made of amorphous silicon and thus can be operated faster. In addition, each pixel was controlled by an external driving circuit. But the poly-silicon TFT technology is capable of directly forming a driving circuit for controlling pixel on the substrate.

As described above, since various driving circuit and elements of the active matrix type OELD can be formed on single substrate, the active matrix type OELD has many advantages such as cost-down, a yield-enhancement and a display-miniature. Also, the OLED does not require a backlight source, so a thickness and a weight of the display using the OLED can be relatively reduced in comparison with a liquid crystal display (LCD). By the above-mentioned reasons, it is a trend that the OELD is used as a display section of a portable information terminal such as a mobile computer, a mobile telephone, a mobile game player or an electronic book etc., instead of the LCD. The development of the OELD having a higher brightness of luminance under a lower operating voltage to accommodate the present trend, have been continuously performed.

SUMMARY OF THE INVENTION

An object of the present invention is to provide an OELD having a high brightness of luminance under a low operating voltage.

In a specific aspect of the active matrix OELD according to the present invention, a pixel having a three-terminal (or triode) organic electro-luminescent device and a driving semiconductor means such as TFT for driving the three-terminal (or triode) organic electro-luminescent device is formed on a transparent substrate. Here, the three-terminal (or triode) organic electro-luminescent device includes a pixel electrode, an opposite electrode arranged with being opposite to the pixel electrode, a luminescent layer interposed between the pixel electrode and the opposite electrode and a control electrode positioned at a given level on which one of the pixel electrode and the opposite electrode is formed and separated from the pixel electrode or the opposite electrode. The control electrode controls a potential between the pixel electrode and the luminescent layer or a potential between the opposite electrode and the luminescent layer and is formed outside of a region which is between the pixel electrode and the opposite electrode. Hereinafter, the three-terminal (or triode) transistor device is referred to as "triode". The semiconductor means is positioned on or under the triode organic electro-luminescent device. An insulating interlayer is interposed between the semiconductor means and the triode organic electro-luminescent device. The semiconductor means has one terminal receiving an external power supply and the other terminal connected to the one of the three electrodes of the triode organic electro-luminescent device through a via hole formed in the insulating interlayer so that current flow of the triode organic electro-luminescent device is controlled.

For representative example, the semiconductor means can be connected to the pixel electrode of the triode organic electro-luminescent device. Hereafter, this structure will be used for the description of present invention for the simplicity, but present invention is not limited within this structure. Specifically, the control electrode is formed at a level on which the pixel electrode is formed and the control electrode is connected through a second via hole having a same height as the via hole prepared in the insulating interlayer, to a power supply which is to be applied to the control electrode. And the pixel electrode and the control electrode are made of same materials, which does not generate an additional process in comparison with the manufacturing process of the conventional two-terminal OLED.

In another example, the control electrode is formed at a level on which the opposite electrode is formed and is connected to a power supply line, wherein it is preferable that the opposite electrode and the control electrode are made of same materials.

The luminescent layer above-mentioned is made of low molecular weight organic materials or polymer materials obtained by a singlet excitation or a triplet excitation.

In another specific aspect of the invention, the active matrix OELD having a source signal driving circuit and a gate signal driving circuit comprises: a plurality of source signals provided from the source signal driving circuit; a plurality of gate signals provided from the gate signal driving circuit and arranged in the matrix form together with the plurality of source signals; a plurality of pixels each arranged at an intersection by one of the plurality of source signals and one of the plurality of gate signals; and a plurality of power supply lines for providing power for driving the plurality of pixels. Wherein the plurality of pixels each has a triode organic electro-luminescent device and a plurality of TFTs electrically connected to the triode organic electro-luminescent device. The triode organic electro-luminescent device includes a first electrode for pixel electrode (anode or drain electrode), an organic luminescent layer formed on the first electrode, a second electrode for opposite electrode (cathode or source electrode) formed on the organic luminescent layer and a third electrode for control electrode (or gate electrode) formed outside of a region which is between the first electrode and said second electrode. The third electrode is for controlling a potential between the first electrode and the organic electro-luminescent layer or a potential between the second electrode and the organic electro-luminescent layer. Also, the active matrix OELD of the present invention further comprises a plurality of third electrode power supply lines for providing power that will be applied to the third electrodes of the pixels.

In one example, the plurality of TFTs include one driving TFT for controlling current flow amount of the triode organic electro-luminescent device and one switching TFT for controlling on/off of the driving TFT. The driving TFT is connected between one of the plurality of power supply lines and the triode organic electro-luminescent device and the triode organic electro-luminescent device is connected between the driving TFT and one of the plurality of third electrode power supply lines. The switching TFT is connected to one of the plurality of source signal lines and connected between one of the plurality of gate signal lines and the driving TFT. The plurality of power supply lines are arranged parallel to the plurality of source signal lines and the plurality of third electrode power supply lines are arranged parallel to the plurality of gate signal lines.

In another example, the plurality of power supply lines and the plurality of third electrode power supply lines are arranged parallel to the plurality of source signal lines. Each of the plurality of power supply lines and each of said plurality of third electrode power supply lines are commonly connected to a pair of driving TFTs and a pair of triode organic electro-luminescent devices assigned to adjacent two pixels which are positioned in an extension direction of the plurality gate signal lines.

In still another example, the active matrix OELD of the present invention further comprises a plurality of erasing gate wirings arranged parallel to the plurality of gate signal lines and a plurality of erasing TFTs each of which is connected between the driving TFT and one of the plurality of power supply lines.

In still another example, each pixel of the active matrix OELD further comprises a first erasing TFT connected between one of a source and a drain of the switching TFT and a gate of the driving TFT and a second erasing TFT connected between a gate of the driving TFT and one of the plurality of power supply lines. Wherein a gate of the first erasing TFT is connected to a (i)th gate signal line, a gate of said switching TFT is connected to a (i+1)th gate signal line and a gate of said second erasing TFT is connected to a (i−1)th gate signal line.

BRIEF DESCRIPTION OF DRAWINGS

FIGS. 1b through 1d depict electronic potential diagrams of energy band of the triode organic EL device of FIG. 1a;

FIG. 2c is a schematic circuit illustrating one embodiment of unit pixel of pixel portion in FIG. 2a;

FIGS. 5b and 5c show gate signal timing diagrams in the OELD employing the pixel structure of FIG. 5a;

DETAILED DESCRIPTION OF EMBODIMENTS

In an active matrix type OELD according to the conventional art, a pixel was obtained by connecting a two-terminal organic light emitting diode device to a semiconductor element. But in an active matrix type OELD of the present invention, a three-terminal organic light emitting transistor (or triode device) is connected to the semiconductor element to form a pixel, thereby controlling luminescence mechanism and thus, a luminescent efficiency of the OELD can be enhanced. Here a Field Effect Transistor (FET), preferably a TFT may be used as the semiconductor element.

Figure 1A:
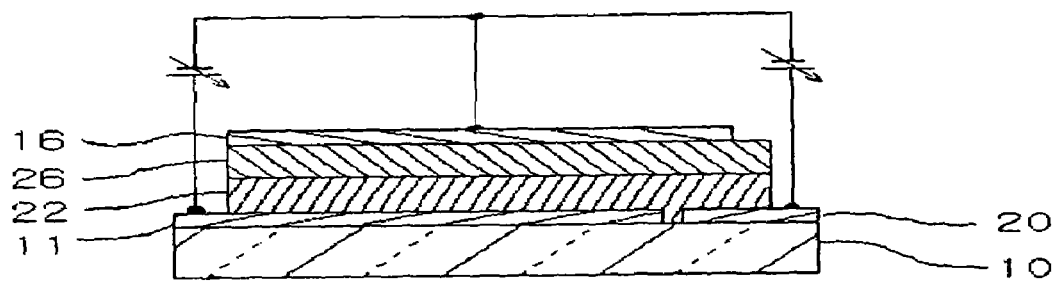
FIG. 1a shows a schematic cross-sectional diagram of a triode organic EL device in accordance with one embodiment, which is used in an OELD of the present invention.

FIG. 1a shows a schematic cross-sectional diagram of a triode organic EL device in accordance with one embodiment, which is used in an OELD of the present invention. The triode organic EL device includes a substrate 10, a first electrode 11 formed on the substrate 10, an EL layer, which may include a first organic layer 22 and/or a second organic layer 26, formed on the first electrode 11, a second electrode 16 formed on the EL layer with being opposite to the first electrode 11 and a third electrode 20 formed under the EL layer for controlling a relative potential of the EL layer. Wherein, the third electrode 20 is formed outside of a region that is between the first electrode 11 and the second electrode 20. The third electrode 20 is made of conductive organic materials, conductive inorganic materials, a metal or complex thereof, preferably one selected from a group consisting of ITO, Ag, Al, Mg, Ca, Li, and compound thereof.

The position and shape of the third electrode 20 are not specifically limited. If the third electrode 20 is formed within region between the anode 11 and the cathode 16 in porous network or grid forms, the third electrode 20 may shield an electric field between the anode 11 and the cathode 16. Thus, the injection and transportation of the charge carriers are directly obstructed and then light-emitting active area may be reduced seriously. Accordingly, the third electrode 20 is preferably formed outside of region, which is defined between the anode 11 and the cathode 16, to overcome the above problems. Also, the third electrode 20 may be encapsulated by insulating organic or inorganic materials. The third electrode 20 may be connected to an external circuit so as to have negative or positive potential, thereby current flow amount of the electrons and the holes migrated into the EL layer can be controlled and the brightness of luminance can be varied. The detail of the triode organic EL device was described in Korean Patent Application Nos. 10-2001-32405 and 10-2001-65442 and a PCT application No. PCT/KR02/103. The OELD of the present invention uses the triode organic EL device referred to in specifications of the above-mentioned applications.

Figure 1B:
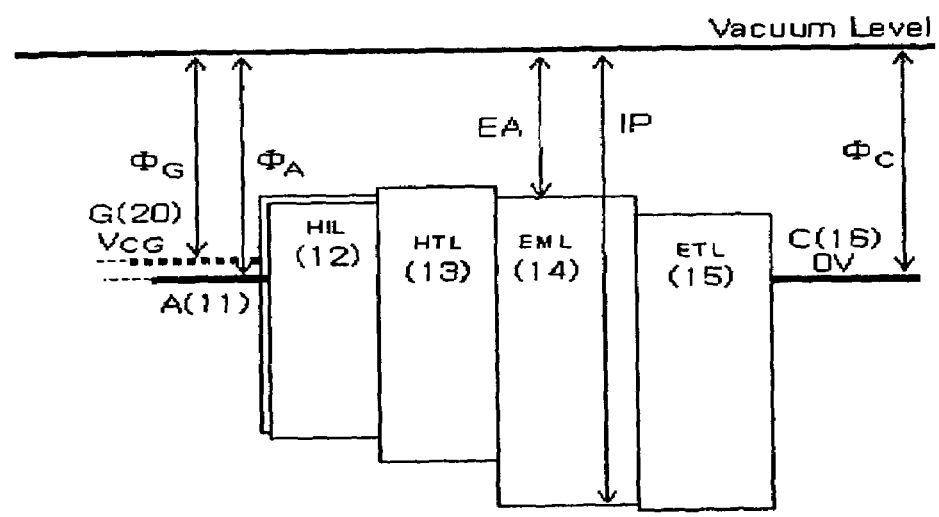

The EL layer may include first organic layer 22 and/or the second organic layer 26, which are composed of the hole injection layer (HIL) 12, the hole transporting layer (HTL) 13, the organic emitting layer (EML) 14 and the electron transporting layer (ETL) 15 (see FIG. 1b). The first electrode 11 serves as an anode (A) for injecting holes into the EL layer, the second electrode 16 serves as the cathode (C) for injecting electrons into the EL layer and the third electrode 20 plays a role of an electrode to control the flows of holes and electrons. In such OELD, the relative potential of the EL layer (22 and/or 26) with respect to the potentials of the first electrode 11 and the second electrode 16 can be adjusted by controlling voltage applied to the third electrode 20. Accordingly, the precise adjustment of flow amount of holes and electrons that are migrated into the organic EL layer (22 and/or 26) by the third electrode 20, can control a light emitting intensity.

The organic EML 14 can be made of various conventional chemical compound used in manufacturing an OLED and preferably can be made of organic monomer, oligomer, or polymer which is conductive, non-conductive, or semi-conductive. The organic monomer may be tris(8-quinolinolato aluminum) ($Alq_3$), bis(10-hydroxybenzo[h]quinolinato) beryllium complex ($BeBq_2$) or tris(4-methyl-8-quinolinolate)aluminum (Almq), which emits light in green color region (540–550 nm). The blue-emitting layer for the organic EML 14 can be made of metal complex such as ZnPBO, Balq (Bis(8-hydroxyquinolato)-( 4-phenylphenolato)aluminum), or of non-metal complex such as strylarylene-based derivatives DPVBi (4,4'-bis(2,2-diphenyl-vinyl)biphenyl), oxadiazole-based derivatives OXA-D, bisstrylanthrancene-based derivatives, bisstrylanthracene-based derivatives such as BczVBi (4,4'-Bis((2-carbazole) vinylene)biphenyl). Also, an organic dopant with very high luminescent efficiency can be added to the organic EML 14 to enhance the luminescent efficiency and the endurance of the organic EL device. Known luminescent polymer such as PPP (poly(para-phenylenylene), PPV (poly(1,4-phenylene vinylene), PVK (polyvinyl carbazole) or polycarbonate can be also used as the organic EML 14.

The HIL 12 and the HTL 13, which can be formed at need, are used so as to facilitate injection of holes from the anode 11, transport safely holes and block electrons. TPD (triphenylamine derivatives; N,N'-bis(3-methylphenyl)-N,N'-diphenylbenzidine), strylamine derivatives or amine derivatives having fused aromatic ring, etc. may be used as the HIL 12 and the HTL 13. The ETL 15, facilitating injection of electrons from the cathode 16, transporting safely electrons to the organic EML 14 and blocking holes, may be made of quinoline derivatives such as $Alq_3$.

That is, the HIL 12, the HTL 13 and the ETL 15 improve the luminescent efficiency of the organic EL device by increasing the numbers of the holes and the electrons flowing into the organic EML 14 and recombining them for light-emission. The thickness of the HIL 12, the HTL 13, the organic EML 14 and the ETL 15 is not specifically defined and is dependent on the manufacturing method, and in general 5 nm through 800 nm. In any case, inorganic layer may be added to the above EL layer.

The anode 11 for injecting holes, may be made of ITO (Indium Tin Oxide), IZO(Indium Zin Oxide), polyaniline or Ag, which has relatively high work function. The cathode 16 for injecting electrons, may be made of Al, Mg, Li, Ca, or complex compound thereof, which has relatively low work function. An inorganic layer such as LiF may be stacked under the cathode 16 at need. The third electrode 20 is made of conductive organic materials such as conductive organic monomer or conductive organic oligomer, conductive inorganic materials, a metal or complex thereof, preferably one selected from a group consisting of ITO, Ag, Al, Mg, Ca, Li, and compound thereof. The third electrode 20 may be connected to the external circuit so as to have negative or positive potential, thereby the potential applied to the third electrode 20 controls potentials of the EL layer (22 and/or 26). As a result, flow of the electrons and the holes migrated into the organic EML 14 (in FIG. 1b) can be controlled and the brightness of luminance can be varied.

Figure 1C:
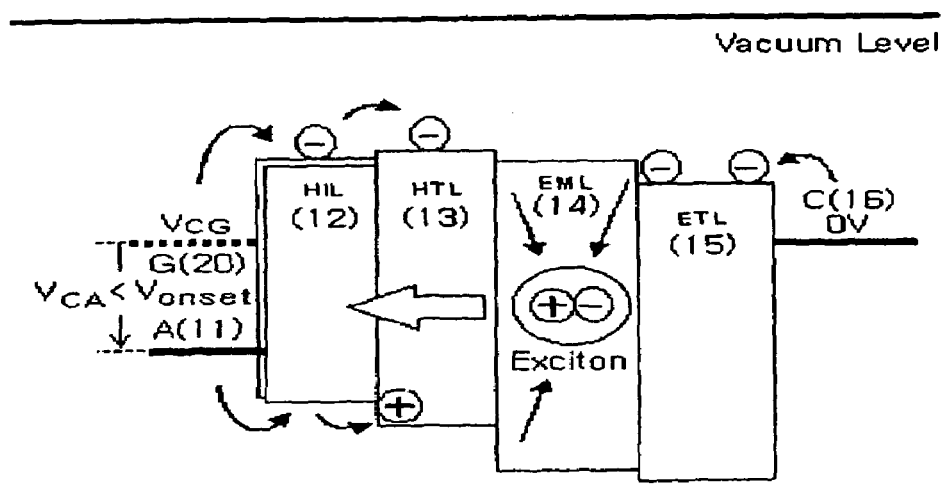
Figure 1D:
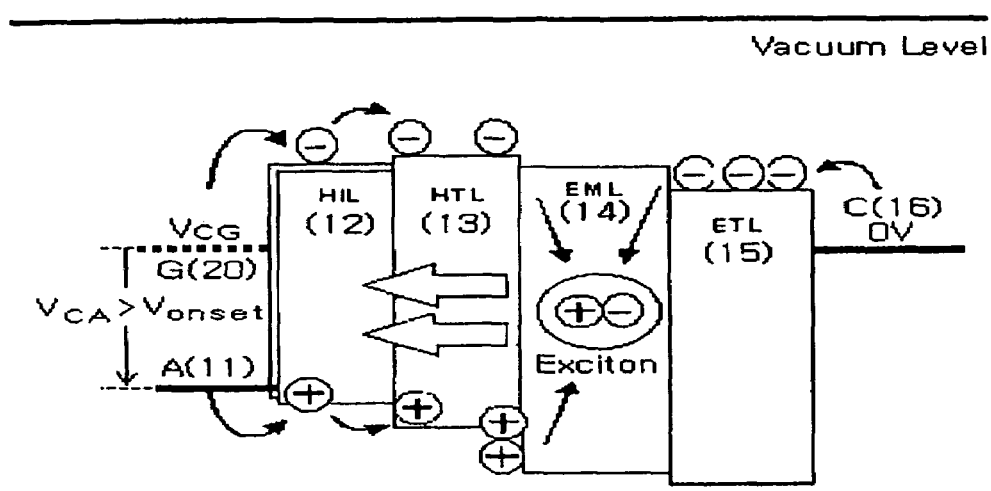

An operation of the triode organic EL device can be comprehended with reference to FIGS. 1b through 1d showing potential diagrams of energy band structure.

When no voltage is applied to the anode 11, the cathode 16 and the third electrode 20, the HIL 12, the HTL 13, the organic EML 14, and the ETL 15 are in thermodynamic equilibrium state so that Fermi levels thereof are identical to each other, as shown in FIG. 1b.

When the voltage $V_{CA}$ is applied between the anode 11 and the cathode 16, under the condition that the third electrode 20 is disconnected from the external electric circuit, the holes are gradually injected from the anode 11 into the highest occupied molecular orbital (HOMO) state of the hole injection layer 12 and also the electrons are gradually injected from the cathode 16 into the lowest unoccupied molecular orbital (LUMO) state of the electron transport layer 15. Here, if the applied voltage $V_{CA}$ is less than a turn-on voltage ($V_{ONSET}$), then the holes and the electrons cannot migrate into the organic EML 14 and there is no occurrence of electro-luminescence, which is the same as the operation of the conventional OLED. While, as shown in FIG. 1c, when the third electrode 20 is connected to the external electric circuit and the voltage $V_{CG}$ is applied between the cathode 16 and the third electrode 20, the holes and the electrons can migrate into the organic EML 14 through the HIL 12, HTL 13, and ETL 15 due to the electric voltage generated by $V_{AG}$. Thereby, electro-luminescence is generated from the radiative recombination of the holes and the electrons in the organic EML 14. Moreover, the additive electrons can be injected from the third electrode 20 into the organic light-emitting layer 14 due to the local electric field effect between the cathode 16 and the anode 11 (FIG. 1C). This means that when the voltage $V_{CG}$ is applied to the third electrode 20, even though voltage $V_{CA}$ is less than $V_{ONSET}$, the electro-luminescence can be occurred. In this condition, when the voltage $V_{CA}$ is gradually increased, concentrations of injected holes and electrons into the organic EML 14 are gradually increased and brightness of luminance is also gradually increased. Features of the triode organic EL device are sensitively dependent on the potential of the third electrode 20.

Figure 1E:
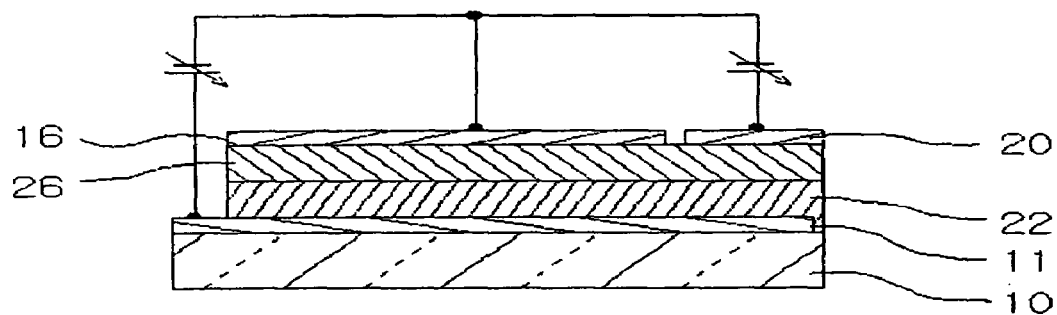
FIG. 1e shows a schematic cross-sectional diagram of a triode organic EL device in accordance with another embodiment, which is used in an OELD of the present invention.

FIG. 1e shows a schematic cross-sectional diagram of a triode organic EL device in accordance with another embodiment, which is used in an OELD of the present invention. The triode organic EL device includes a substrate 10, a first electrode 11 formed on the substrate 10, an EL layer, which may include a first organic layer 22 and/or a second organic layer 26, formed on the first electrode 11, a second electrode 16 formed on the EL layer with being opposite to the first electrode 11 and a third electrode 20 formed on the EL layer for controlling a relative potential of the EL layer. Wherein, the third electrode 20 is formed outside of a region that is between the first electrode 11 and the second electrode 20.

Figure 1F:
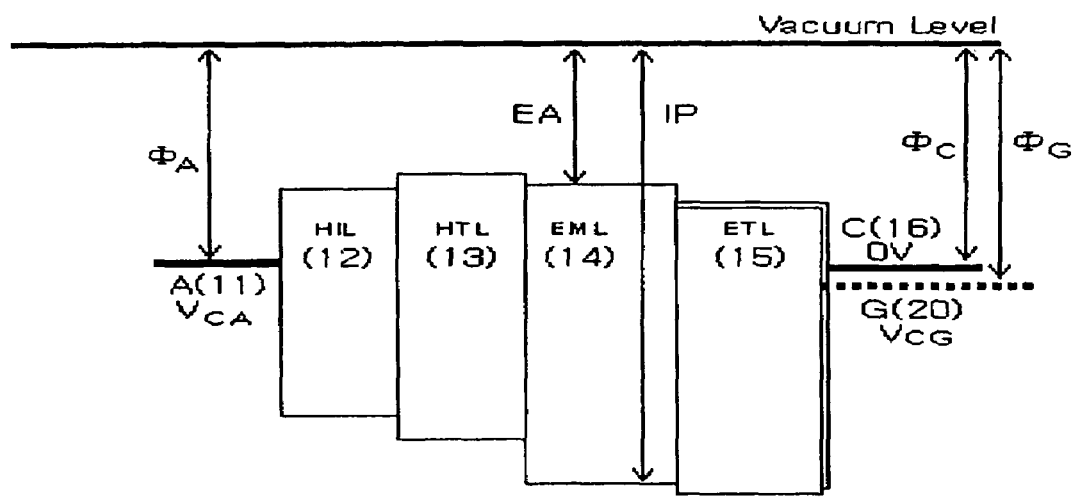
FIGS. 1f through 1h depict electronic potential diagrams of energy band of the triode organic EL device of FIG. 1e.
Figure 1G:
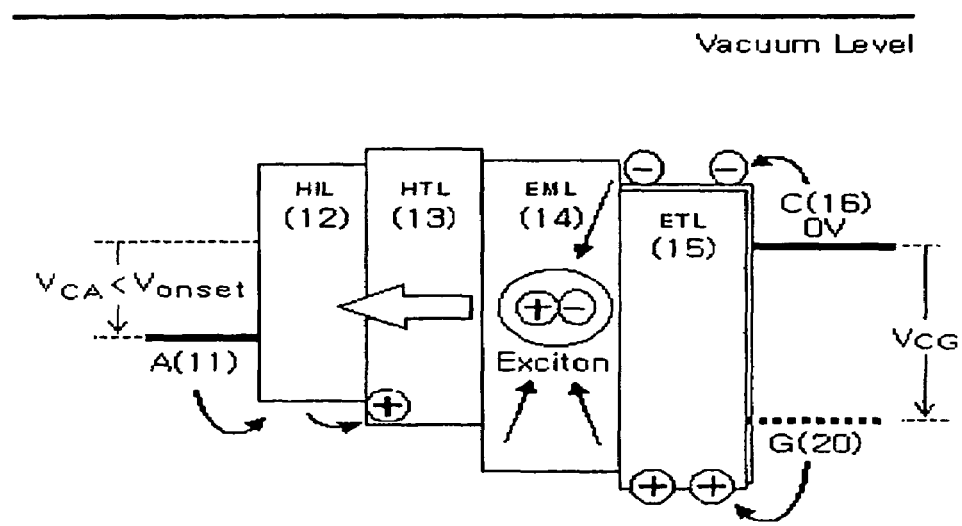
Figure 1H:
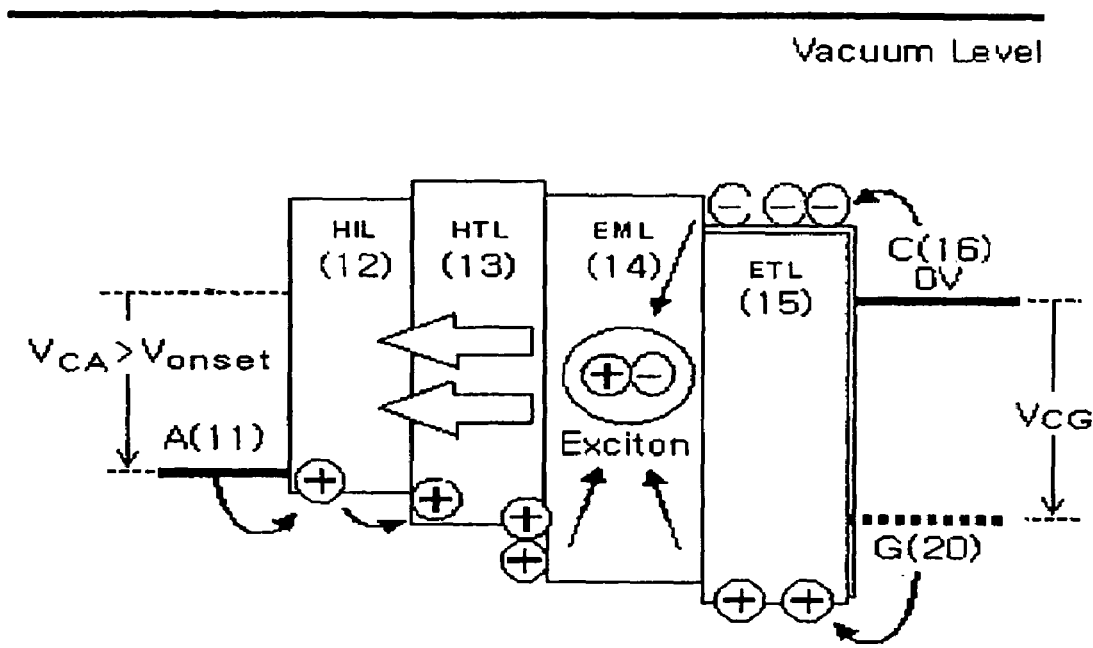

An operation of the above triode organic EL device can be comprehended with reference to FIGS. 1f through 1h showing potential diagrams of energy band structure.

If no voltage is applied to the anode 11, the cathode 16 and the third electrode 20, then the HIL 12, the HTL 13, the organic EML 14, and the ETL 15 are in thermodynamic equilibrium state so that Fermi levels thereof are identical to each other, as shown in FIG. 1f.

In FIG. 1f, when the voltage $V_{CA}$ is applied between the anode 11 and the cathode 16, under the condition that the third electrode 20 is disconnected from the external electric circuit, the holes are gradually injected from the anode 11 into HOMO state of the HIL 12 and also the electrons are gradually injected from the cathode 16 into LUMO state of the ETL 15. Here, if the applied voltage $V_{CA}$ is less than a turn-on voltage ($V_{ONSET}$), then the holes and the electrons cannot migrate into the organic EML 14 and there is no occurrence of electro-luminescence, which is the same as the operation of the conventional OLED. While, as shown in FIG. 1g, when the third electrode 20 is connected to the external electric circuit and the voltage $V_{CG}$ is applied between the cathode 16 and the third electrode 20, the holes and the electrons can migrate into the organic EML 14 through the HIL 12, HTL 13, and ETL 15 due to the potential of $V_{CG}$. Thereby, electro-luminescence is generated from the radiative recombination of the holes and the electrons in the organic EML 14. Moreover, the additive holes can be injected from the third electrode 20 into the organic EML 14 due to the local electric field effect between the cathode 16 and the anode 11 (FIG. 1g). That is, when the voltage $V_{CA}$ is applied to the third electrode 20, the electro-luminescence can be generated even by the voltage $V_{CA}$ less than $V_{ONSET}$. When the voltage $V_{CA}$ is gradually increased, concentrations of injected holes and electrons into the organic EML 14 are gradually increased and brightness of luminance is also gradually increased, as shown in FIG. 1h.

As described above, the triode organic EL device can emit even under the condition that voltage $V_{CA}$ is less than voltage $V_{ONSET}$ and brightness of luminance of the triode organic EL device is more higher than that of the conventional OLED.

Since the active matrix type OELD has a less operating voltage than the passive matrix type OELD for obtaining the same brightness of luminance, power consumption of the active matrix type OELD can be more suppressed in comparison with the passive matrix type OELD. In the active matrix type OELD, the brightness of luminance can be achieved regardless of the number of the pixels contrast to the passive matrix type OELD. That is, the current density of the organic EL device in the active matrix type OELD is almost constantly low even though there is larger number of pixels, while the current density of the organic EL device in the passive matrix type OELD is highly increased for maintaining a given brightness of luminance as the number of pixel is increased.

Finally, for achieving high definition image by increasing the number of pixels, the active matrix type OELD having relatively low current density (low power consumption) is advantageous over the passive matrix type OELD in view of power consumption. Therefore, in the case that the triode organic EL device is employed in the active matrix type OELD, the operating voltage for obtaining a given brightness of luminance can be more down or the luminescent efficiency under a given operating voltage is more enhanced, thereby being able to displaying image with high brightness of luminance.

From now, embodiments of the active matrix type OELD employing the triode organic EL device according to the present invention will be detail explained.

Embodiment 1

Figure 2A:
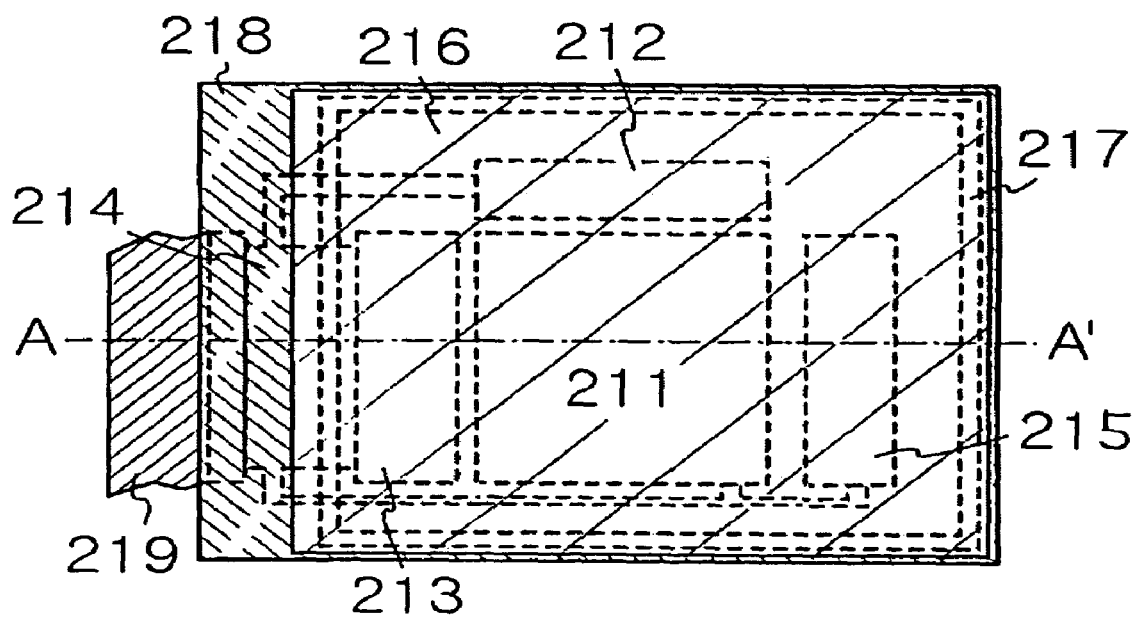
FIG. 2a shows a schematic diagram of an OELD in accordance with one embodiment of the present invention.
Figure 2B:
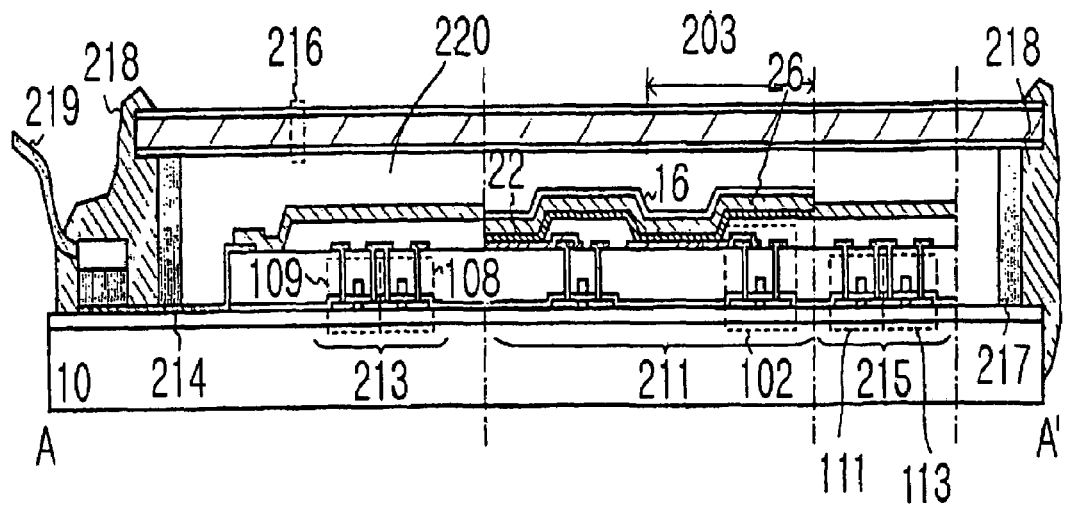
FIG. 2b depicts a schematic cross-sectional diagram of the OELD in FIG. 2a along A–A'.
Figure 2C:
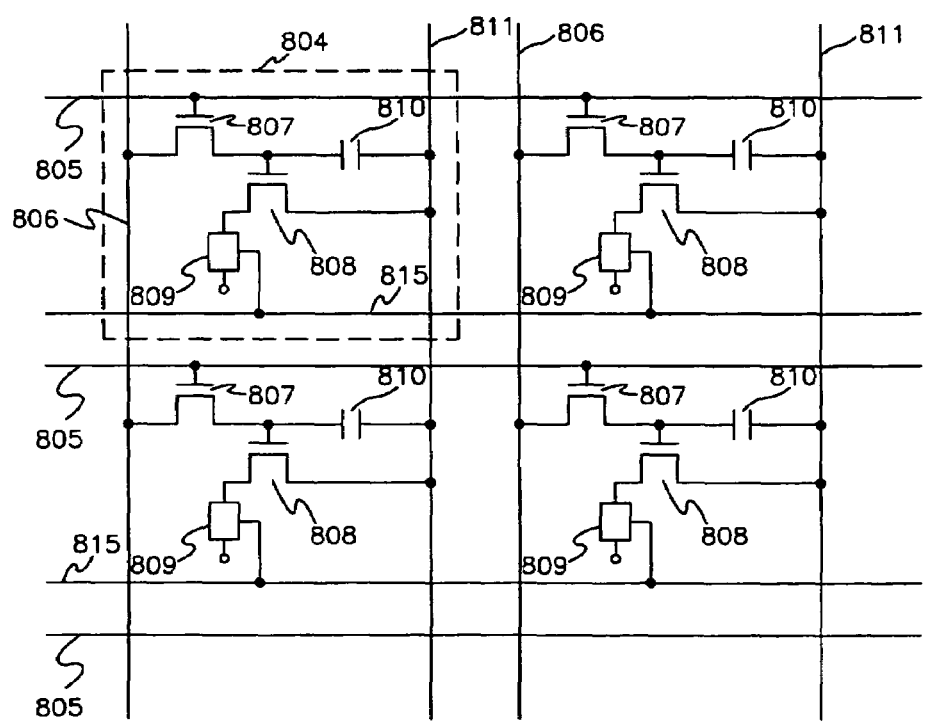
Figure 2D:
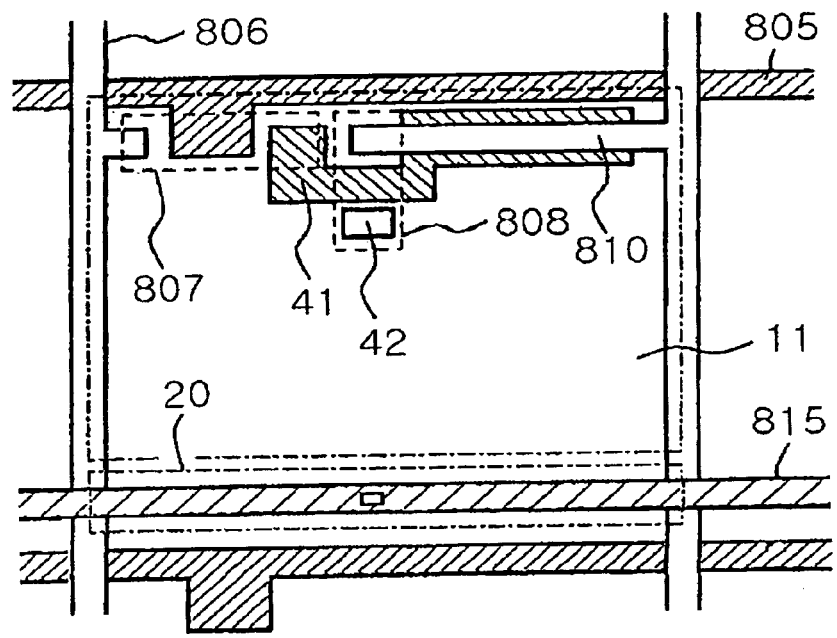
FIG. 2d illustrates a layout for the circuit of FIG. 2c.

FIG. 2a shows a schematic diagram of an OELD in accordance with one embodiment of the present invention, FIG. 2b depicts a schematic cross-sectional diagram of the OELD in FIG. 2a along A–A', FIG. 2c is a schematic circuit illustrating one embodiment of unit pixel of a pixel portion in FIG. 2a and FIG. 2d illustrates a layout for the circuit of FIG. 2c. FIGS. 3a–3d illustrate schematic cross-sectional views of unit pixel which may be employed in pixel portion of FIG. 2a.

An active matrix type OELD according to the present invention includes a pixel portion 211 through which picture image is displayed and a source signal driving circuit 212, a gate signal driving circuit 213 and a third electrode driving circuit 215 whose outputs are delivered to the pixel portion 211. The signals transmitted to these driving circuits 212, 213, 215 are supplied through an input wiring 214 from a flexible printed circuit boards connector (FPC) 219. An unexplained numeral 216 stands for a cover prepared on the triode organic EL device according to the present invention, an unexplained numeral 217 represents a passivation film for preventing a penetration of moisture and oxygen and an unexplained numeral 218 stands for a sealant made of resin.

The gate signal driving circuit 213 is for controlling timing of signal transmitted to a pixel 203 of the pixel portion 211 and has a shift register, a buffer, a latch, a transmission gate or a level shifter. CMOS circuit that is composed of an N channel TFT 109 and a P channel TFT 108 as shown in FIG. 2b may be unit of the gate signal driving circuit 213. The structures of the shift register, the buffer, the latch, the transmission gate and the level shifter have been known.

The source signal driving circuit 212 that is not shown in FIG. 2b is for editing/producing a signal inputted to a source signal line. The source driving circuit 212 has a digital signal sampling circuit for sampling input signal inputted over one line period, a memory circuit for storing the sampled digital signal therein, a memory circuit for converting the memorized digital signal to a corresponding pulse of duration and a rectifying circuit for producing constant current in duration of the pulse, which all are known and may be constructed by the CMOS circuit.

The third electrode driving circuit 215 is for controlling timing of signal transmitted to the third electrode 20 and is connected to a power supply circuit of a given voltage level and to a third electrode power supply line. Also, like the gate driving circuit 213, the third electrode driving circuit 215 has a shift register, a buffer, a latch, a transmission gate or a level shifter. CMOS circuit that is composed of an N channel TFT 111 and a P channel TFT 113 as shown in FIG. 2b may be preferably unit of the third electrode driving circuit 215. In addition, the third electrode driving circuit 215 may be partially or wholly commonly shared with the gate driving circuit 213.

The above mentioned driving circuits 212, 213 and 215 may be formed on a substrate on which the pixel portion 211 are formed like this embodiment or may be independently prepared in the form of chip and connected to the pixel portion 211.

As shown in FIG. 2b, the pixel portion 211 includes a plurality of pixels 203 and a plurality of TFTs for switching and driving wherein one switching TFT (not shown) and one driving TFT 102 are assigned to each of plurality of pixels 203.

The pixel 203 in FIG. 2b is the same to a pixel structure of FIG. 3a, so the structure and a process for manufacturing the pixel 203 in FIG. 2b will be explained with reference to FIG. 3a.

Figure 3A:
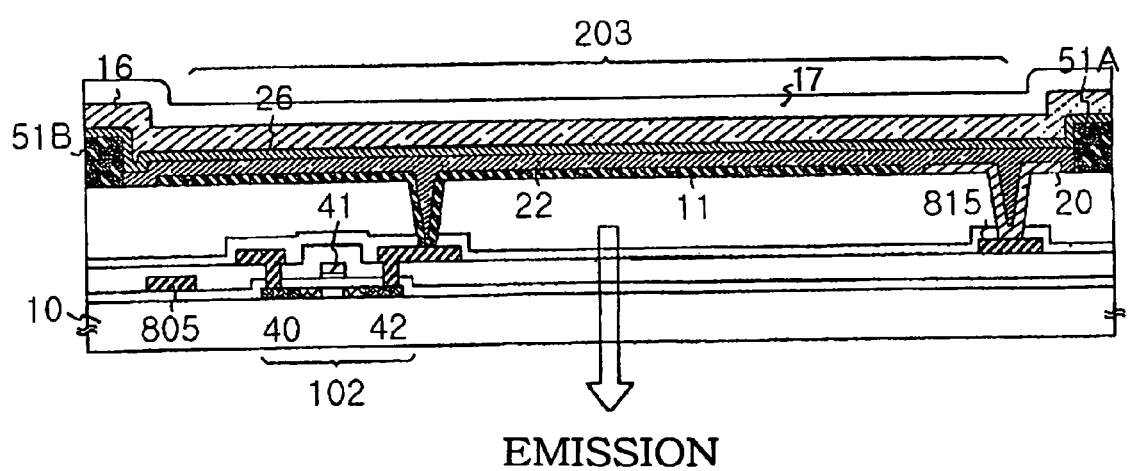
FIG. 3a illustrates a schematic cross-sectional view of unit pixel in accordance with one embodiment of the present invention, the unit pixel including the triode organic EL device of the OELD.

Referring to FIG. 3a, on a substrate 10 transparent to a visible light are prepared a driving TFT 102 for controlling amounts of current flowing through the triode organic EL device 11, 20, 22, and 26 or 16 and a switching TFT (not shown) for controlling a voltage applied to the driving TFT 102. A drain 42 of the driving TFT 102 is connected to the anode 11 of the triode organic EL device wherein the anode 11 is a pixel electrode. The third electrode 20 of the triode organic EL device is formed at a level on which the pixel electrode 11 is formed.

As to the manufacturing process of pixels, the driving TFT 102 having a source 40, the drain 42 and a gate 41 and the switching TFT (not shown) are formed on the substrate 10. Thereafter a power supply line 811 connected to the source 41 of the driving TFT 102 and a third electrode power supply line 815 for providing power to the third electrode 20 of the triode organic EL device are simultaneously formed. A glass, quartz, crystallized glass or plastic may be used as the substrate 10. The substrate 10 may be made of semiconductor materials such as silicon or gallium arsenide, according to a structure and a use of the triode organic EL device. The gate wiring 805 may be formed during the formation of the gate 41 of the driving TFT 102.

An insulating interlayer 15 composed of silicon nitride layer of about 50 nm and acrylic layer of about 1000 nm is applied on the resultant in which the power supply lines 811 and 815 are formed, and then is planarized. The silicon nitride layer is for preventing ion impurities originated from the outside from introducing to a semiconductor layer in an apparatus employing the triode organic EL device. The acrylic layer is for planarizing and instead thereof, thermosetting or optical-setting organic resin such as polyamide, polyimide and BCB (benzocyclobutene) may be used for planarization. The organic resin such as acrylic layer has absorption property, so a surface of the organic resin layer is preferably plasma-treated for compactly reforming the surface thereof after the coating of organic resin. The plasma-treatment also prevents alkaline metal such as Lithium which is used as the cathode 16 of the triode organic EL device from dispersing into the semiconductor layer in the apparatus employing the triode organic EL device.

Via holes for exposing the power supply lines 811 and the third electrode power supply lines 815 are formed in the planarized insulating interlayer 15. Conductive materials with high work function (for example 4.5 through 5.5 eV) is coated on the substrate having the via holes and then patterned so that the pixel electrode (or the anode 11) and the third electrode 20 are simultaneously formed. Typically, materials for forming the anode 11 are ITO, IZO, tin oxide or compound thereof. In another method for forming the third electrode 20, a mask may be used. After forming the anode 11 on the substrate 10 except for a portion on which the third electrode 20 will be formed, conductive materials which are different from those of the third electrode 20 is coated on the substrate 10 except for the portion on which the third electrode 20 will be formed, by using the mask, thereby forming the third electrode 20. Thereafter EL layer (22 and/or 26) is sequentially formed on the pixel electrode (or anode 11) and the third electrode 20. The thickness of the EL layer (22 and/or 26) ranges from 80 nm through 200 nm (typically 100 through 120 nm), thickness of the cathode 16 is 180 nm through 300 nm (typically 200 through 250 nm). And, EL layer may have a single-layered or a multi-layered structure that is well known. In forming the EL layer, an EL layer which emits red light, an EL layer which emits green light and an EL layer which emits blue light may be simultaneously formed. In addition, the EL layer includes a layer for providing a color display in cooperation with a color conversion layer or with a color filter. The materials composing the EL layer includes fluorescent materials which emit EL light by the singlet excitation and/or phosphorescent materials which emit EL light by triplet excitation.

Next, a cathode 16, as an opposite electrode, is formed on the EL layer. Conductive materials having low work function (about 2.5 through 3.5 eV) such as Al, Ca, Mg, Li, Ag or Ba, for example Mg:Ag or Al:Li, can be used as the materials of the cathode 16. It is preferable that the EL layer containing luminescent materials and the cathode 16 are sequentially formed without exposing to an atmosphere. Also, a conductor for sinking a leakage current between the pluralities of pixels may be formed between the pluralities of pixels.

The triode organic EL device 203 manufactured is covered with a passivation layer 17. The passivation layer 17 is for preventing the triode organic EL device from the moisture and oxygen. Silicon nitride, silicon oxynitride, aluminum oxide, titan oxide or carbon (especially diamond type carbon) can be used as materials of the passivation layer 17. An unexplained numeral 51A and 51B indicate pixel separation barriers for separating unit pixel 203 in the pixel portion 211.

As described above, when the driving TFT is connected to the anode 11 of the triode organic EL device, the cathode 16 is the opposite electrode. Here if the P channel TFT is used as the driving TFT, the power consumption of the OELD can be suppressed. The switching TFT may be composed by an N channel TFT or a P channel TFT.

In view of manufacturing the OELD, when the power supply line 811 connected to the source 40 of the driving TFT 102 within the pixel is formed, the third electrode power supply line 815 connected to the third electrode 20 can be simultaneously formed. In addition thereto, a via hole for connecting the third electrode power supply line 815 to the third electrode 20 can be simultaneously formed when forming via holes connecting the drain 42 to the pixel electrode 11. Therefore the height of via holes contacting to the drain 42 is the substantially same as that of via holes connecting the third electrode power supply line 815 to the third electrode 20. In the case that the materials of the anode 11 are the same as those of the third electrode 13, during the manufacturing of the pixel electrode 11 which is connected to the drain 42 of the driving TFT 102 through the via holes formed on the driving TFT 102, the third electrode 20 which is connected to the third electrode power supply line 815 through the via holes formed on the third electrode power supply line 815 can be simultaneously formed near the pixel electrode 11. Accordingly, pixel including the triode organic EL device can be fabricated without increasing manufacturing steps resulted from the third electrode 20. During the manufacturing the pixel, especially during the manufacturing the driving TFT and the switching TFT of the pixel portion 211, TFTs 108 and 198 composing the gate signal driving circuit 213, a source signal driving 212 circuit and TFTs 111 and 113 composing the third electrode driving circuit 213 can be simultaneously formed.

After the pluralities of pixels, the gate signal driving circuit 213, the source signal driving circuit 212 and the third electrode driving circuit 215 are formed, the passivation film 217 is applied on the resultant and then the EL device is encapsulated by a sealing part 218 or a preventing layer so that the active matrix type OELD according to the present invention is sealed up in a sealing space 220 and is not exposed to the outside. The sealing space 220 may be filled with an inert gas (typically nitrogen gas or rare gas), resin or inert liquid (typically carbon fluoride liquid which is represented as perchloroalkan). In addition, introduction of a moisture absorbent (for example barium oxide) or deoxydizer to the sealing space 220 is also effective. After the sealing the device by packing process, the FPC 219 for connecting a terminal from the device or circuit formed on the substrate to an external terminal is manufactured so that a final OELD in FIG. 2b is made.

The structure of the pixel including the triode organic EL device of the OELD is not limited by the shape shown in FIG. 2b or FIG. 3a and can be variously modified. Some of the various modifications are illustrated in FIGS. 3b through 3d.

Figure 3B:
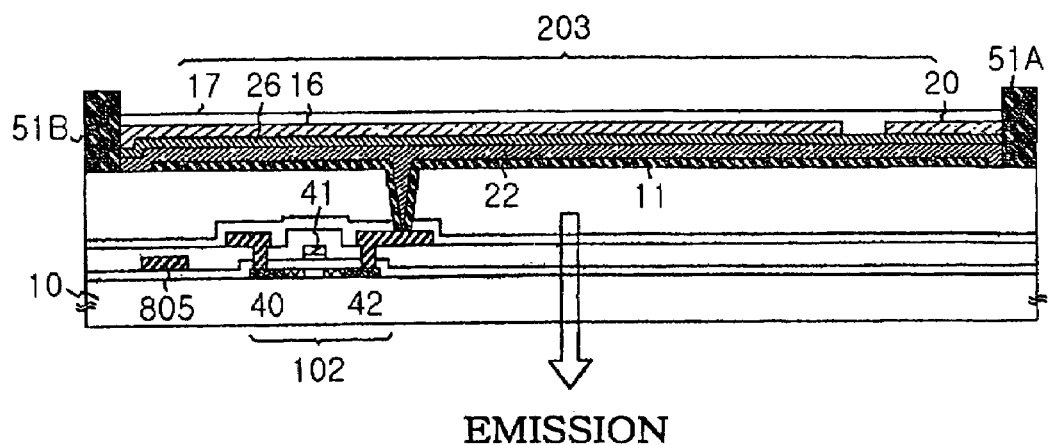
FIG. 3b illustrates a schematic cross-sectional view of unit pixel in the OELD in accordance with another embodiment of the present invention, the unit pixel including the triode organic EL device of the OELD.

Referring to FIG. 3b, a process for manufacturing a pixel including conventional OLED can be applied excepting that after forming the EL layer in the pixel portion, conductive materials are coated on an entire surface of the substrate and then patterned during the formation of the cathode 16 so that the cathode 16 and the third electrode 20 are simultaneously made. Wherein, it is preferable that materials of the cathode 16 are the same as those of the third electrode 20. At need, the third electrode 20 and the cathode 16 can be formed by using the same or different materials and by using a plurality of masks. Wherein the cathode 16 and the third electrode power supply line 815 are successively formed after the power supply lines of the driving circuits are formed and then a preventing layer is formed.

Figure 3C:
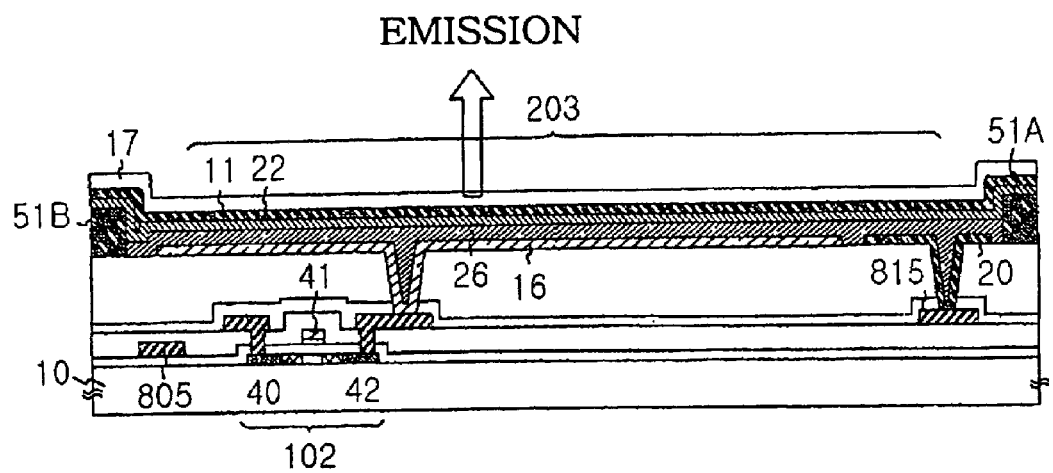
FIG. 3c illustrates a schematic cross-sectional view of unit pixel in the OELD in accordance with still another embodiment of the present invention, the unit pixel including the triode organic EL device of the OELD.
Figure 3D:
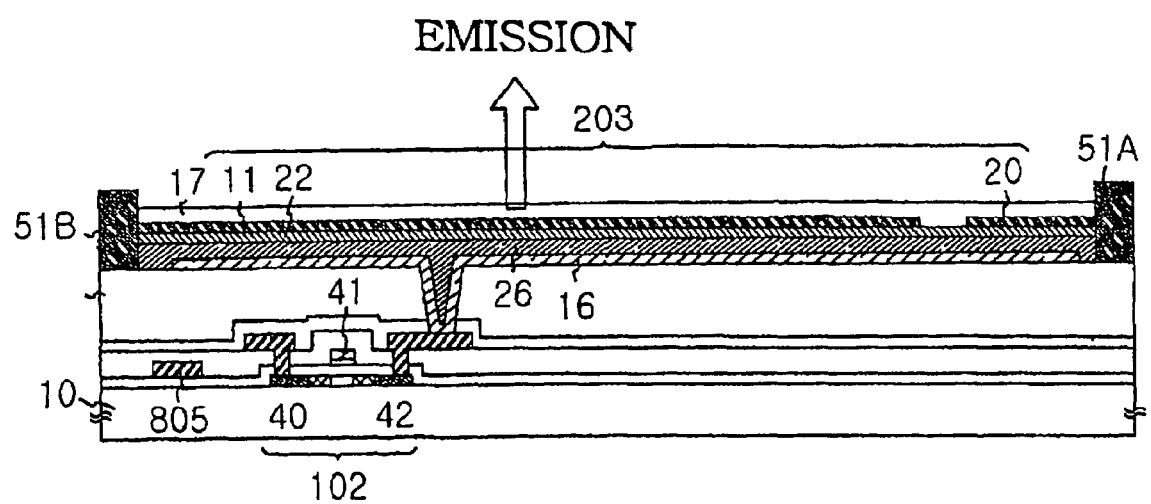
FIG. 3d illustrates a schematic cross-sectional view of unit pixel in the OELD in accordance with even still another embodiment of the present invention, the unit pixel including the triode organic EL device of the OELD.

FIGS. 3c and 3d illustrate that the cathode 16 of the triode organic EL device is electrically connected to the driving TFT 102. Preferably, the pixel electrode is formed of materials of the cathode 16 and the driving TFT 102 is composed of an N channel TFT considering the power consumption. The third electrode 20 of the triode organic EL device is formed under the EL layer as shown in FIG. 3c or the third electrode 20 is formed on the EL layer as shown in FIG. 3d, like FIGS. 3a and 3b. The opposite electrode is the transparent anode 11 and the light is emitted to the upper direction of the device, which is contrary to the devices in FIGS. 3a and 3b.

Further, though only a planar top gate type TFT is used as the driving TFT in FIGS. 3a through 3d, an inverted staggered bottom gate type TFT can be used as the driving TFT as well as the switching TFT.

In the specification, a potential of the opposite electrode of the EL device according to the present invention is called for "an opposite potential" and a potential of the third electrode is called for "a third electrode potential". A power source for supplying power to the opposite electrode is indicated as "an opposite power" and a power source for supplying the power to the third electrode is indicated as "a third electrode power". An "EL driving voltage" means an applied voltage to the EL layer by the pixel electrode, the opposite electrode and the third electrode.

The equivalent circuit of the pixel portion employing the pixel shown in FIG. 3a or 3b is shown in FIG. 2c and layout thereof is illustrated in FIG. 2d. Two TFTs 807 and 808 and a triode organic EL device 809 are prepared in the pixel 804. A driving TFT 808 is corresponded to the driving TFT 102 in FIG. 3a or FIG. 3c, the triode organic EL device is corresponded to the device comprising the anode 11, the organic layers 22 and 26, the cathode 16 and the third electrode 20 as shown in FIG. 3a or FIG. 3c.

In detail, a gate electrode of the switching TFT 807 is a protrusion from a gate signal line 805 and is connected to the gate signal line. One of a source and a drain of the switching TFT 807 is connected to a source signal line 806 and the other is connected to a gate electrode of the driving TFT 808 and one terminal of a capacitor 810 of the pixel. The capacitor 810 is formed by a protrusion from the power supply line 811, an extension of the driving TFT 808 and an insulating interposed between the protrusion and the extension. The capacitor 810 is for maintaining the gate voltage of the driving TFT 808 when the switching TFT 807 is not selected (that is off state).

One of a source and a drain of the driving TFT 808 is connected to the power supply line 811 and the other is connected to the anode 11 of the triode organic EL device 809 which has the anode 11, the opposite cathode (16 in FIG. 3a) and the third electrode 20 disposed near the anode 11. The power supply line 811 is connected to an external power supply (not shown) that is prepared outside of the substrate having the pixel portion and thus gets a predetermined potential. Also, the power supply line 811 is connected to the capacitor 810. The third electrode 20 is connected to the third electrode power supply line 815 which is connected to a third electrode power supply (not shown) prepared outside of the substrate in which the pixel portion is formed, thereby getting a predetermined third electrode potential.

In other words, the switching TFT 807 and the driving TFT 808 each has a multi-gate structure with channels formed between the source region and the drain region. In particular, it is effective that the switching TFT 807 has the multi-gate structure in view of suppression of an off-current of the switching TFT 807 which is a drain current generated in an "off state" of the switching TFT 807. The switching TFT 807 and the driving TFT 808 both may be composed of the N channel TFT and the P channel TFT. Where the anode (transparent electrode) is the pixel electrode and the cathode is the opposite electrode, as shown in FIG. 3a, it is preferable that the driving TFT 808 is composed of the P channel TFT. On the contrary, where the anode (transparent electrode) is the opposite electrode and the cathode is the pixel electrode, as shown in FIG. 3c, it is preferable that the driving TFT 808 is composed of the N channel TFT.

In pixels that are turned on by the gate signal line 805 and the source signal line 806, data signal transmitted to the source signal line 806 through the switching TFT 807 is charged at the capacitor 810. The charged data in the capacitor 810 is applied to the gate electrode of the driving TFT 808. During the signal application, the driving TFT 808 is opened so that the signal transmitted from the power supply line 811 is applied to the anode of the triode organic EL device. Here, the opposite electrode of the triode organic EL device is connected to the opposite voltage prepared outside of the substrate with the pixel portion so that the opposite potential is always constantly applied. Also, the signal transmitted from the third electrode power supply lines 815 is applied to the third electrode 20 so that the potential of the third electrode 20 is a predetermined level. Accordingly, emission is generated at the EL layer interposed between the opposite electrode and the pixel electrode.

In the present embodiment, the capacitor is included in the unit pixel. However, the present invention is not limited thereby and the present invention can be applied to the pixel structure without the capacitor.

In summary, the active matrix type OELD according to one embodiment of the present invention includes the source signal driving circuit 212, the gate signal driving circuit 213, the third electrode driving circuit 215 and the pixel portion 211. In the pixel portion 211, a plurality of source signal lines provided from the source signal driving circuit 212 and a plurality of gate signal lines provided from the gate signal driving circuit 213 are arranged in the form of matrix type and a plurality of pixels are arranged at an intersection portion by the source signal lines and the gate signal lines. Also, in the pixel portion 211, there are a plurality of power supply lines for supplying power for driving pixels and a plurality of third electrode power supply lines which are provided from the third electrode driving circuit and which supply voltage to the third electrode of the triode organic EL device composing the pixels. The pixel includes the triode organic EL device, the driving semiconductor element for controlling current of the triode organic EL device and the switching semiconductor element for controlling a gate voltage of the driving semiconductor element.

Embodiment 2

Figure 4:
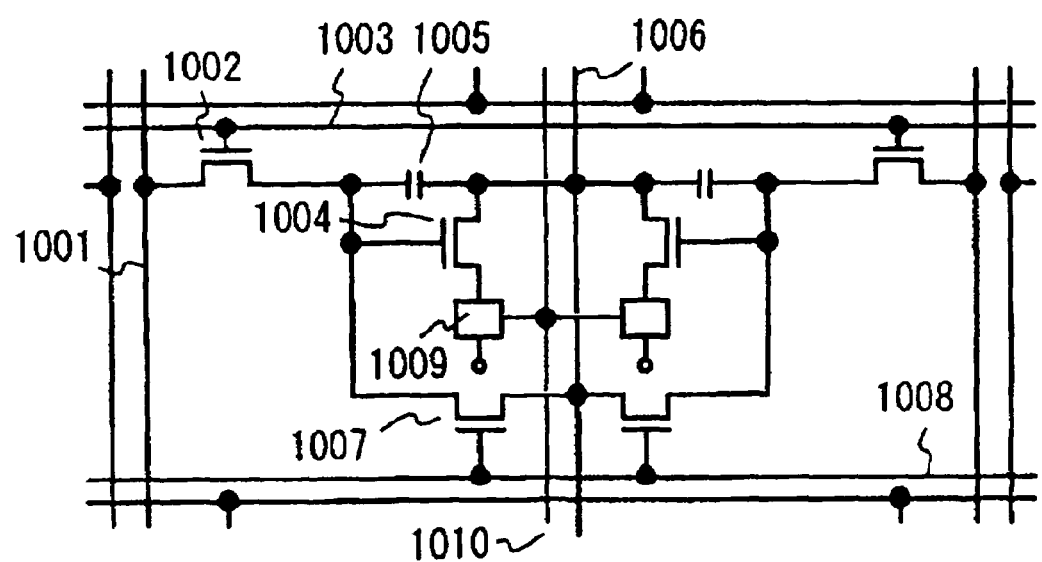
FIG. 4 is a schematic circuit illustrating another embodiment of unit pixel of pixel portion.

FIG. 4 illustrates another embodiment of unit pixel of pixel portion, wherein three semiconductor elements are assigned to each pixel.

Numeral "1001" indicates a source wiring of a switching TFT 1002, numeral "1003" indicates a gate wiring of the switching TFT 1002 and numeral "1004" means a driving TFT. Numeral "1005" stands for a capacitor (which may be omitted), numeral "1006" indicates a power supply line V and numeral "1007" means an erasing TFT. Further, numeral "1008" indicates an erase gate wiring and numeral "1009" indicates a triode organic EL device.

A drain of the erasing TFT 1007 is connected to a gate of the driving TFT 1004 so that the gate voltage of the driving TFT 1004 can be compulsory varied. A source of the erasing TFT 1007 is connected to the common power supply line 1006 and a gate thereof is connected to the erasing gate wiring 1008. A drain of the driving TFT 1004 is connected to the triode organic EL device 1009 and a source thereof is connected to the common power supply line 1006 and one terminal of the capacitor 1005. The other terminal of the capacitor 1005 is connected to the gate of the driving TFT 1004 and the drain of the switching TFT 1002. A source of the switching TFT 1002 is connected to the source wiring 1001. And the third electrode of the triode organic EL device 1009 is commonly connected to the third electrode power supply line 1010 together with a third electrode of a triode organic EL device of the adjacent pixel.

The switching TFT 1002 and the driving TFT 1004 may be the same as those of the first embodiment. The erasing TFT 1007 may be formed of an N channel TFT or a P channel TFT. However, preferably the switching TFT 1002 and the erasing TFT 1007 are made of the same type channel TFT so as to reduce an 'off-current' thereof. Also, one power supply line 1006 and one third electrode power supply line 1010 are commonly shared for two adjacent pixels. That is, two adjacent pixels are symmetrically positioned with respect to the power supply line 1006 and the third electrode power supply line 1010. Therefore, the numbers of the power supply line 1006 and the third electrode power supply line 1010 can be reduced, so emission area of the pixel portion can be sufficiently achieved and thus the brightness of luminance can be enhanced. The third electrode of the triode organic EL device 1009 in this embodiment, may be formed at a level on which the anode is formed or at a level on which the cathode is formed, as shown in FIGS. 2a–2d.

Embodiment 3

Figure 5A:
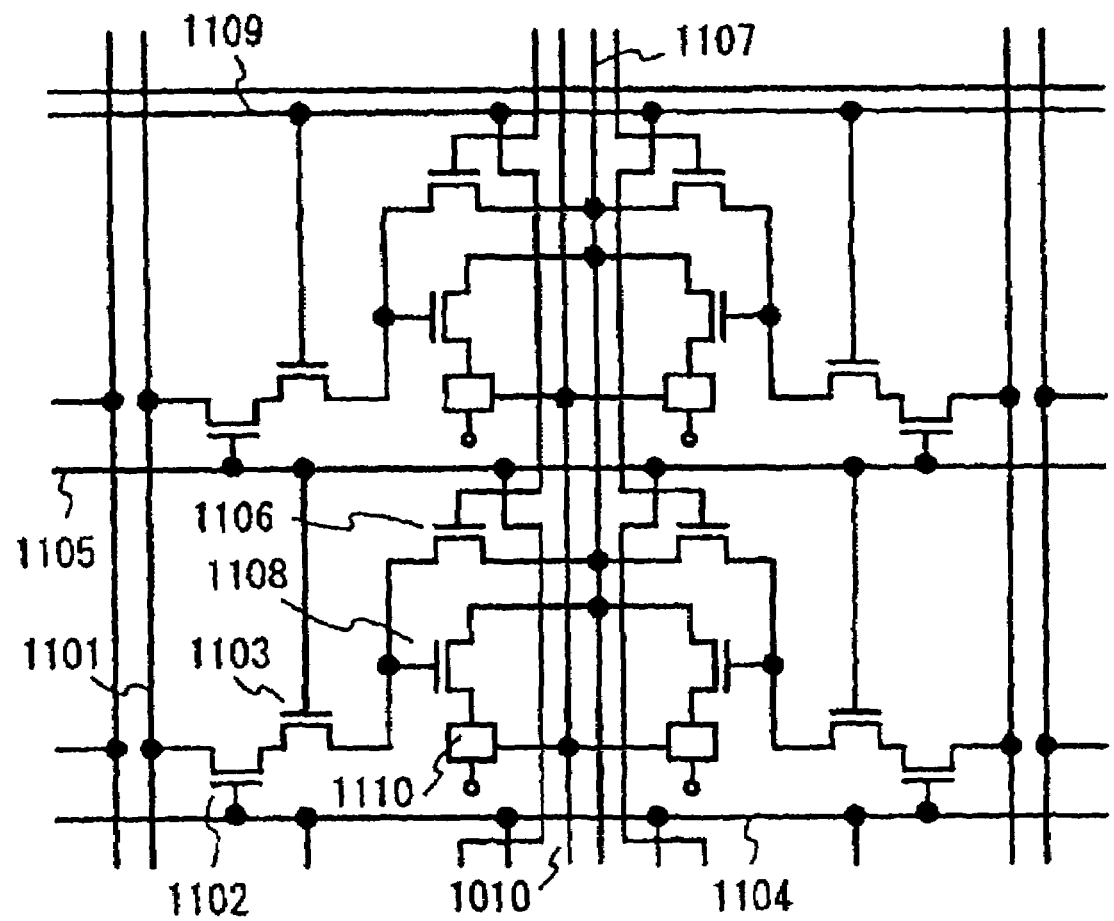
FIG. 5a is a schematic circuit illustrating still another embodiment of unit pixel of a pixel portion.

FIG. 5a illustrates yet another embodiment of unit pixel of the pixel portion, wherein four semiconductor elements are assigned to each pixel.

Numeral "1101" indicates a source wiring of a first switching TFT 1102 and numeral "1103" indicates a second switching TFT serially connected to the first switching TFT 1102. Numeral "1104" means a (i+1)th gate wiring connected to a gate of the first switching TFT 1102. Numeral "1005" indicates a (i)th gate wiring connected to a gate of the second switching TFT 1003. Numeral "1010" stands for a third electrode power supply line for supplying power to the third electrode of the triode organic EL device 1110. Numeral "1106" indicates an erasing TFT.

A source of the erasing TFT 1106 is connected to the power supply line 1107 and a gate thereof is connected to a (i−1)th gate wiring. In this case, a drain of the erasing TFT 1106 is connected to a gate of the driving TFT 1108 so that a gate voltage of the driving TFT 1108 is compulsory varied. And a drain of the erasing TFT 1106 is connected to a gate of the driving TFT 1108 and a gate thereof is connected a drain of the second switching TFT 1103. A source of the driving TFT 1108 is connected to the power supply line 1107 and a drain thereof is connected to the triode organic EL device 1110. The third electrode of the triode organic EL device 1110 is commonly connected to the third electrode power supply line 1101 together with a third electrode of a triode organic EL device of the adjacent pixel. A gate of the first switching TFT 1102 is connected to a (i+1)th the wiring 1104 and a drain thereof is connected to a drain of the second switching TFT 1102. A source of the first switching TFT 1102 is connected to the source wiring 1101.

The switching TFTs 1102 and 1003 and the driving TFT 1104 may be formed by the TFTs which are the same as those of the first embodiment. The erasing TFT 1106 may be formed of an N channel TFT or a P channel TFT.

The difference of the pixel structure in this embodiment as compared with the first embodiment lies in that the switching TFT is modified to the first switching TFT 1102 and the second switching TFT 1102, the gate of the first switching TFT 1102 is connected to an adjacent next gate wiring, that is the (i+1) th gate wiring 1104 and the gate of the erasing TFT 1106 is connected to an adjacent previous gate wiring, that is the (i−1) th gate wiring 1109.

Figure 5B:
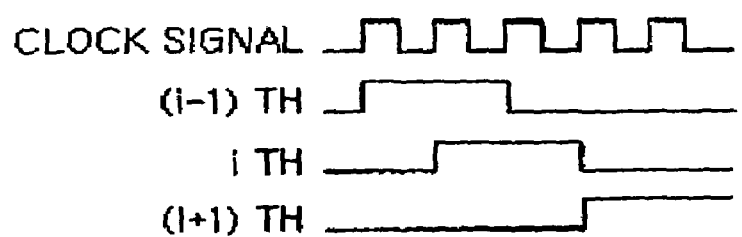
Figure 5C:
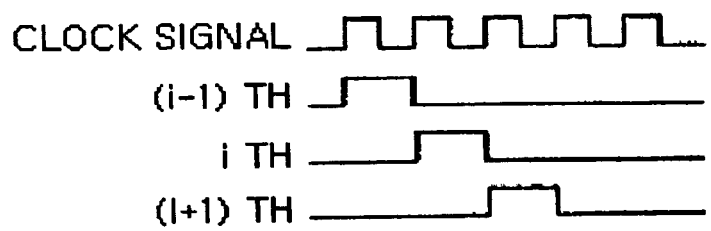

In the case that the pixel structure in FIG. 5a is employed, EL pixel can be operated by properly handling gate signals inputted to the (i−1)th gate wiring 1109, the (i)th gate wiring 1105 and the (i+1) th gate wiring 1104. Wherein FIG. 5b illustrates timing charts of the gate signals when the data signal is written into the pixel and FIG. 5c illustrates timing charts of the gate signals when the data signal is erased from the pixel. A (i−1) timing chart means signal timing chart through the (i+1) th gate wiring 1109, a (i) timing chart means signal timing chart through the (i) th gate wiring 1105 and a (i+1) timing chart means signal timing chart through the (i+1) th gate wiring 1104.

According to this embodiment, the erasing TFT 1106 is connected to the gate wiring, so the erasing gate wiring can be omitted. Therefore, effective emission area of the pixel can be increased, there is no need to form a circuit for driving the erase gate wiring and thus yield of the OELD can be enhanced.

Here, the third electrode of the triode organic EL device 1110 in the embodiment, may be formed at a level on which the anode or the cathode is formed, as shown in FIGS. 2a–2d.

In the above-mentioned embodiments, two through four semiconductors are assigned to one pixel, which cannot limit the present invention and the present invention can be applied to a pixel employing more than five TFTs.

The above-identified triode organic EL device has further the third electrode for controlling injection amount of electrons and holes besides the anode and the cathode. Thus, EL driving voltage (turn-on voltage) of the triode organic EL device according to the present invention is less than that of the conventional OLED. Also, high definition display can be obtained without increasing a driving current density of the EL device composing the pixel, in the active matrix type OELD of the present invention. The active matrix type OELD according to the present invention is capable of displaying high-resolution image with high brightness by using low operating voltage (low power consumption), thereby enhancing the display reliability. And such an OELD can be adopted for various light sources of electrical appliances, typically a light source used as a back or front illumination of the LCD or a light source of the illuminative appliance.

On the other hand, when the intensity of the radiation per square of the pixel portion is 200 cd/m$^2$, current per square required at the pixel portion of the conventional OELD employing the conventional OLED, is about 4 mA/cm$^2$ assuming that the luminescent efficiency is 5 cd/A. Accordingly since the required current amount is highly increased proportional to an area of the pixel portion when the area of the pixel portion is increased, it is difficult for a switch such as TFT to simultaneously control the potential and current applied to the power supply line from the power supply.

While in the OELD of the present invention, power potential, the third electrode potential and the opposite potential are pre-controlled and maintained, so it is very efficient to realize a large-size screen panel by using the present invention.

EXAMPLE 1

Merit of the triode organic EL device of the present invention with respect to the conventional OLED is high brightness of luminance under low voltage. Hereinafter, one experimental example of the EL device is described.

The triode organic EL device of pixel shown in FIG. 3a is manufactured. Copper pthalocyanine (CuPc), aromatic amine of 4,4',4'-tris[N-3 methylphenyl-N-phenyl-amino], triphenylamine(mTDATA), 4,4'-bis[N-naphthyl-N-phenyl-amino]biphenyl (α-NPD) and Alq3 are sequentially deposited on the pixel electrode 11 (first electrode, anode) made of transparent ITO and the third electrode 20 made of transparent ITO. Then Al:Li layer as the second layer 16 was formed thereon to form the triode organic EL device sample.

As to the thickness of each organic layer, a HIL of 4,4',4'-tris[N-3 methylphenyl-N-phenyl-amino] has 40 nm thickness, a HTL of triphenylamine(mTDATA) has 20 nm thickness, an organic EML of α-NPD has 60 nm thickness and an electron injecting layer of Alq3 has 20 nm thickness. The first electrode 11, the second electrode 16 and the third electrode 20 are connected to an external circuit so as to have positive or negative potential.

Figure 6A:
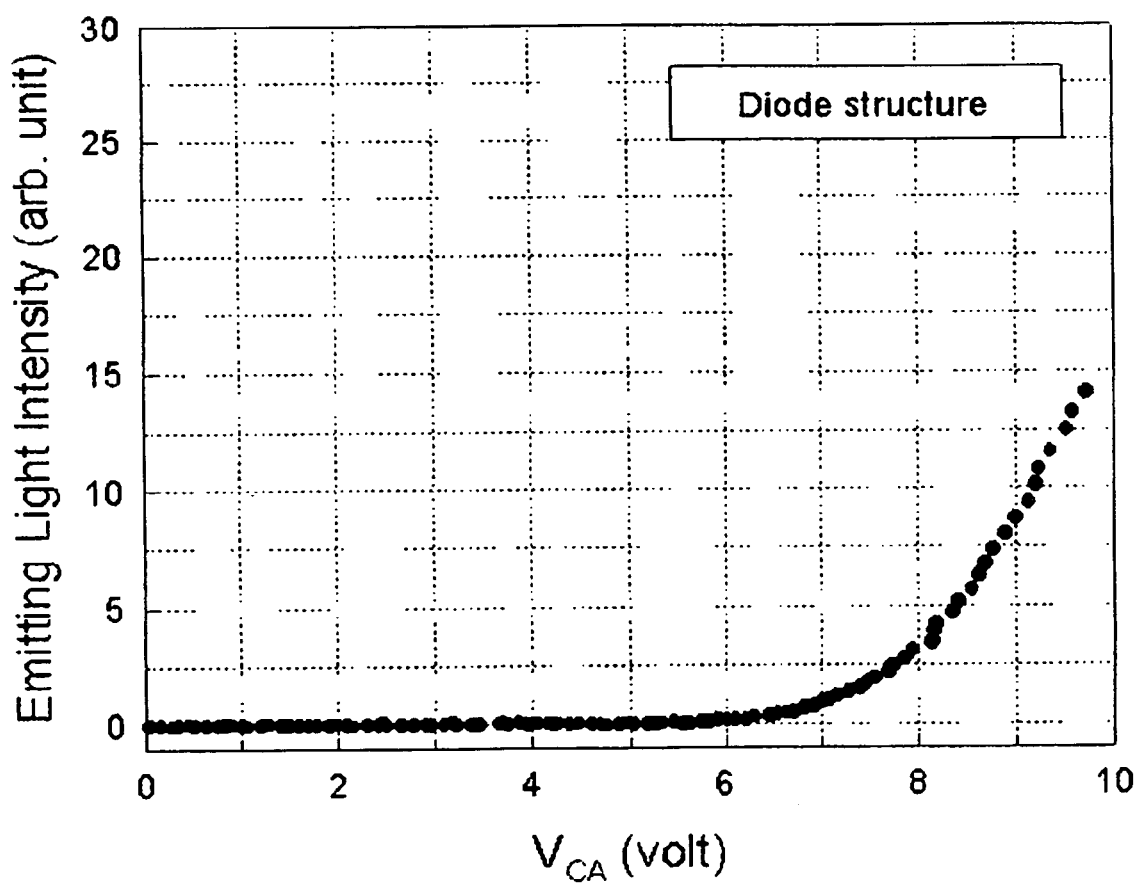
FIG. 6a is a graph showing an applied voltage vs. brightness of the conventional OLED employed in the OELD.
Figure 6B:
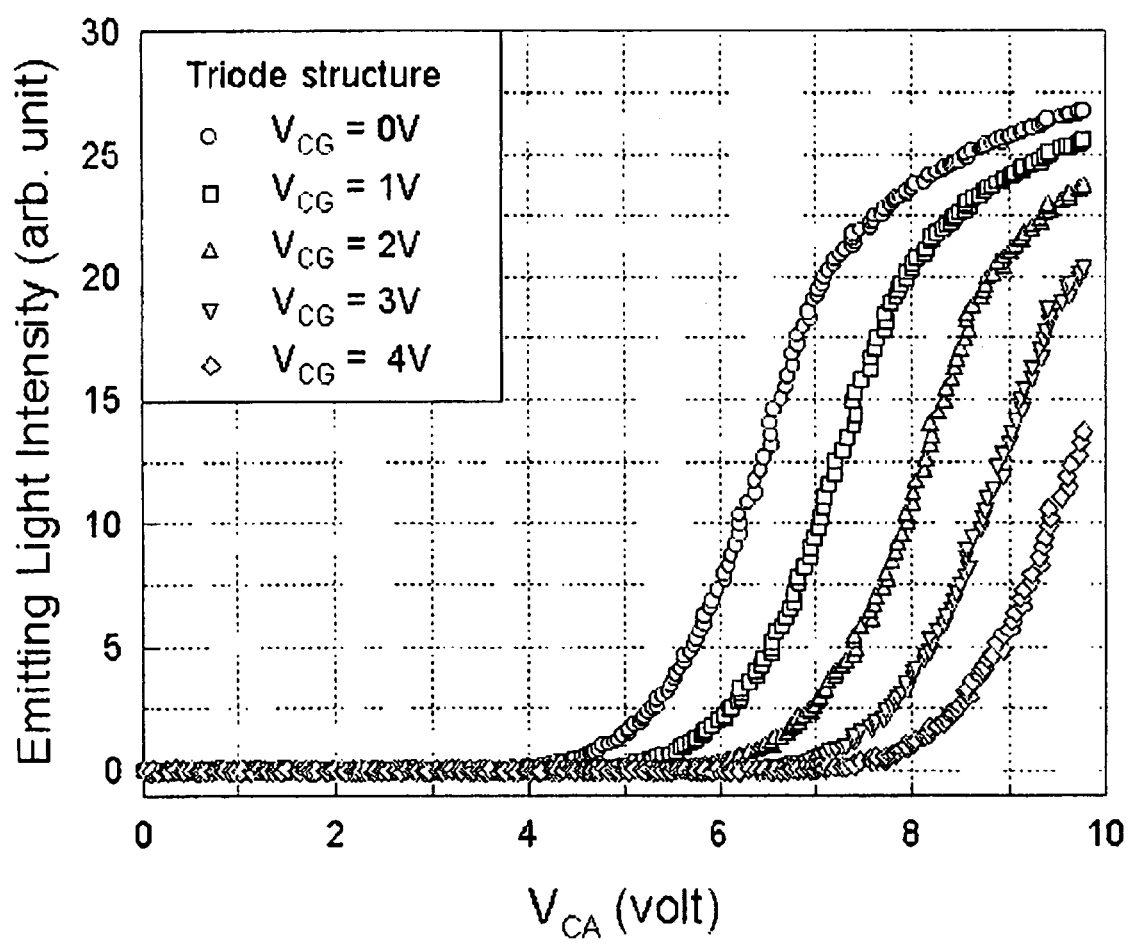
FIG. 6b is a graph showing an applied voltage vs. brightness of the present triode organic EL device employed in the OELD.

FIG. 6a and FIG. 6b are graphs illustrating emitting light intensity vs. $V_{CA}$ with respect to potential of the third electrode 20 of the triode organic EL device.

After the third electrode 20 is disconnected from the external electric circuit, the voltage $V_{CA}$ is applied between the first electrode 11 and the second electrode 16. Then, the emitting light intensity is illustrated in FIG. 6a, as a comparative example. When the third electrode 20 is disconnected, an operation of the triode organic EL device is the same as that of the conventional OLED. That is, an electroluminance is initially occurred near $V_{CA}$=6 V ($V_{ONSET}$) and the brightness of luminance is increased as the $V_{CA}$ is increased. As shown in FIG. 6a, the brightness near $V_{CA}$=9 V is 1000 (arb. Unit), so voltage $V_{CA}$ for obtaining brightness of luminance within 1000 (arb. Unit) is from 6V to 9V and the controllable voltage range of $V_{CA}$ is about 3V.

On the other hand, measurement of the emitting light intensity from the EL device in which a voltage $V_{CG}$ is applied to the third electrode 20 and the variation of the voltage $V_{CA}$ is made, is illustrated in FIG. 6b.

As shown in FIG. 6b, the voltage $V_{CA}$ at which the electro-luminance is initially occurred is remarkably reduced below $V_{ONSET}$ (6V) as the voltage $V_{CG}$ is reduced and the brightness of the triode organic EL device under the low voltage $V_{CA}$ is more highly increased than the conventional OLED, which cannot be obtained by the conventional OLED, which is showing the graph of FIG. 6a. In FIG. 6b, when the voltage $V_{CG}$ is 0V, the electro-luminance is generated near $V_{CA}$=4V and the brightness of luminance is gradually increased as the voltage $V_{CA}$ is increased. Here, the brightness near $V_{CA}$=9 V is 2500 (arb. Unit), so voltage $V_{CA}$ for obtaining brightness of luminance within 2500 (arb. Unit) is from 4V to 9V and the controllable voltage range of $V_{CA}$ is widely about 5V. That is, lowest limit of the controllable voltage range of $V_{CA}$ is shifted to lower voltage and the controllable voltage range of $V_{CA}$ is more increased in comparison with the conventional OLED, which demonstrate that the triode organic EL device in FIG. 3a is useful for a control of the brightness and a realization of the gray scale.

According to the experimental example, when the triode organic EL device is employed in the active matrix type OELD, the EL driving voltage $V_{CA}$ at which the electro-luminance is generated is down and thus a driving voltage of TFT for driving a pixel including the triode organic EL device can be reduced. When the driving voltage of TFT is down, deterioration of the TFT due to a hot carrier effect can be suppressed. Therefore OELD with high brightness can be easily obtained as well as the power consumption of the OELD is reduced and the manufacturing steps and cost required for manufacture can be down. In addition, electrical appliances having high brightness and low power consumption can be made by using the OELD of the present invention as a light source or a displaying part of the electrical appliances.

As described above, the active matrix type OELD according to the present invention employs a triode organic EL device having relatively low operation voltage, so low power consumption, a high brightness and an enhanced reliability of the OELD and extension of life time of the EL layer in the OELD can be accomplished. Thus, the active matrix type OELD of the present invention can be applied to an apparatus employing an light-emitting device, such as an electrical appliance, a display, a television, a digital camera, a computer, a lap-top computer, a mobile computer, a portable reproducing instrument with recording medium, a screen, an electrical bulletin, an advertising board, a goggle type display, a display for automobile, a video camera, a printer display, a telecommunication device, a display for telephone, a mobile phone, an audio, a game player, a wireless portable information terminal, an electrical pocket book, an electrical book, a CD reproduction device, a luminescent accessory and a forward or a backward projector.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. An active matrix type organic electro-luminescent display (OELD) comprising a pixel having a triode organic electro-luminescent device and a driving semiconductor for driving said triode organic electro-luminescent device;

said triode organic electro-luminescent device formed on a substrate having an anode electrode, a cathode electrode arranged opposite to said anode electrode, a luminescent layer interposed between said anode electrode and said cathode electrode and a control electrode positioned at a given level on which one of said anode electrode and said cathode electrode is formed and separated from said one of said anode electrode and said cathode electrode, said control electrode connected to said cathode electrode and having negative or positive potential so as to control flow of holes from said anode electrode and electrons from said cathode electrode to said luminescent layer; and said driving semiconductor positioned on or under said triode organic electro-luminescent device, an insulating interlayer being interposed between said driving semiconductor and said triode organic electro-luminescent device, and said driving semiconductor has one terminal receiving an external power supply and another terminal connected to one of said electrodes of the triode organic electro-luminescent device via a first hole formed in said insulating interlayer so that current of said triode organic electro-luminescent device is controlled.

2. The active matrix type OELD of claim 1, wherein said anode electrode is connected to said driving semiconductor via said first hole and said control electrode is formed at a level on which said anode electrode is formed and said control electrode is connected via a second hole having a same height as the first hole in said insulating interlayer, to a power supply which is to be applied to said control electrode.

3. The active matrix type OELD of claim 2, wherein said anode electrode and said control electrode are made of same materials.

4. The active matrix type OELD of claim 3, wherein said control electrode is made of one of indium tin oxide (ITO), indium zinc oxide (IZO) and compounds thereof.

5. The active matrix type OELD of claim 1, wherein said anode electrode is connected to said driving semiconductor via said first hole and said control electrode is formed at a level on which said cathode electrode is formed and is connected to a power supply line prepared on the insulating interlayer positioned on the control electrode.

6. The active matrix type OELD of claim 5, wherein said cathode electrode and said control electrode are made of same materials.

7. The active matrix type OELD of claim 6, wherein said control electrode is made of one selected from Al, Ca, Mg, Li, Ag, Ba and compound thereof.

8. The active matrix type OELD of claim 1, wherein said driving semiconductor is made of a thin film transistor (TFT).

9. The active matrix type OELD of claim 1, wherein said luminescent layer is made of low molecular weight organic materials or polymer materials obtained by a singlet excitation or a triplet excitation.

10. An active matrix type OELD having a source signal driving circuit and a gate signal driving circuit, the active matrix type OELD comprising:
   a plurality of source signals provided from said source signal driving circuit;
   a plurality of gate signals provided from said gate signal driving circuit and arranged in the matrix form together with the plurality of source signals;
   a plurality of pixels each arranged at an intersection by one of said plurality of source signals and one of said plurality of gate signals, wherein said plurality of pixels each has a triode organic electro-luminescent device and a plurality of field effect transistors (TFTs) electrically connected to said triode organic electro-luminescent device,
   said triode organic electro-luminescent device having a first electrode,
   an organic luminescent layer formed on the said first electrode,
   a second electrode formed on the organic luminescent layer and
   a third electrode formed outside of a region which is between said first electrode and said second electrode, said third electrode having negative or positive potential so as to control flows of holes from said first electrode and electrons from said second electrode to said luminescent layer;
   a plurality of power supply lines for providing power for driving said plurality of pixels; and
   a plurality of third electrode power supply lines for providing power which will be applied to said third electrodes of said pixels.

11. The active matrix type OELD of claim 10, wherein the plurality of TFTs include one driving TFT for controlling current flow of said triode organic electro-luminescent device and one switching TFT for controlling on/off of said driving TFT, and wherein said driving TFT is connected between one of said plurality of power supply lines and said triode organic electro-luminescent device, said triode organic electro-luminescent device is connected between said driving TFT and one of said plurality of third electrode power supply lines, said switching TFT is connected to one of said plurality of source signal lines and connected between one of said plurality of gate signal lines and said driving TFT, said plurality of power supply lines are arranged parallel to said plurality of source signal lines and said plurality of third electrode power supply lines are arranged parallel to said plurality of gate signal lines.

12. The active matrix type OELD of claim 10, wherein the plurality of TFTs include one driving TFT for controlling current flow of said triode organic electro-luminescent device and one switching TFT for controlling on/off of said driving TFT, and wherein said driving TFT is connected between one of said plurality of power supply lines and said triode organic electro-luminescent device, said triode organic electro-luminescent device is connected between said driving TFT and one of said plurality of third electrode power supply lines, said one switching TFT is connected to one of said plurality of source signal line and connected between one of said plurality of gate signal lines and said driving TFT, said plurality of power supply lines and said plurality of third electrode power supply lines are arranged parallel to said plurality of source signal lines, and each of the plurality of power supply lines and each of said plurality of third electrode power supply lines are commonly connected to a pair of driving TFTs and a pair of triode organic electro-luminescent devices assigned to adjacent two pixels which are positioned in an extension direction of said plurality gate signal lines.

13. The active matrix type OELD of claim 12, further comprising a plurality of erasing gate wirings arranged parallel to said plurality of gate signal lines and a plurality of erasing TFTs each of which is connected between said driving TFT and one of said plurality of power supply lines.

14. The active matrix type OELD of claim 12, wherein each pixel further comprises another switching TFT connected between one of a source and a drain of said switching TFT and one of said plurality of power supply lines and an erasing TFT connected between a gate of said driving TFT and one of said plurality of power supply lines, wherein a gate of said another switching TFT is connected to a $(i)$th gate signal line, a gate of said switching TFT is connected to a $(i+1')th$ gate signal line and a gate of said erasing TFT is connected to a $(i-1)$th gate signal line.

15. The active matrix type OELD of claim 10, further comprising a third electrode driving circuit connected to one of said plurality of third electrode power supply lines for controlling timing of signal transmitted to said third electrodes each.

* * * * *